(12) United States Patent
Chiu

(10) Patent No.: US 11,107,730 B1
(45) Date of Patent: Aug. 31, 2021

(54) METHOD OF MANUFACTURING SEMICONDUCTOR DEVICE WITH ANTI-FUSE STRUCTURES

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/865,428

(22) Filed: May 4, 2020

(51) Int. Cl.
*H01L 21/768* (2006.01)
*H01L 21/8238* (2006.01)
*H01L 27/112* (2006.01)
*H01L 21/84* (2006.01)

(52) U.S. Cl.
CPC .. *H01L 21/76831* (2013.01); *H01L 21/76886* (2013.01); *H01L 21/823878* (2013.01); *H01L 21/845* (2013.01); *H01L 27/11206* (2013.01)

(58) Field of Classification Search
CPC ....... H01L 21/76831; H01L 21/823878; H01L 21/76886; H01L 21/845; H01L 27/11206; H01L 21/76205; H01L 21/76208; H01L 21/76224; H01L 21/76286; H01L 21/76291; H01L 21/762; H01L 21/76
See application file for complete search history.

(56) References Cited

U.S. PATENT DOCUMENTS

2019/0019803 A1* 1/2019 Cheng ............... H01L 27/11206

FOREIGN PATENT DOCUMENTS

TW  I483347 B  5/2015

* cited by examiner

*Primary Examiner* — Thanhha S Pham
(74) *Attorney, Agent, or Firm* — CKC & Partners Co., LLC

(57) ABSTRACT

A method of manufacturing a semiconductor structure including following operations is provided. A substrate extending along a first direction is provided. A trench crossing the substrate is then formed to define a first active region and a second active region. A lower isolation structure is formed in the trench, in which the lower isolation structure exposes a portion of a sidewall of the substrate. The exposed sidewall of the substrate is oxidized to form an upper isolation structure on the lower isolation structure, in which the upper isolation structure extends into the substrate. A conductive structure embedded in the upper isolation structure is formed. A first transistor and a second transistor are respectively formed in the first active region and the second active region.

10 Claims, 11 Drawing Sheets

METHOD OF MANUFACTURING SEMICONDUCTOR DEVICE WITH ANTI-FUSE STRUCTURES

BACKGROUND

Field of Invention

The present invention relates to a method of manufacturing a semiconductor structure. More particularly, the present invention relates to a method of manufacturing a semiconductor structure with anti-fuse structures.

Description of Related Art

Fuse elements are commonly used in semiconductor devices, such as semiconductor memory or logic devices. Anti-fuses have electrical characteristics opposite to those of fuses and may be used for the repair of defective cells by swapping the defective cells with redundant cells.

In general, one anti-fuse needs to be controlled by one control gate adjacent thereof. Therefore, a unit cell is defined as 1T1C, which refers to one transistor (control gate) and one capacitance (anti-fuse). However, when the number of anti-fuse is increasing, the conventional of 1T1C structure will occupy a big area. In order to achieve a high density memory cell or redundancy, the unit cell should be as small as possible.

SUMMARY

In accordance with an aspect of the present disclosure, a method of manufacturing a semiconductor structure is provided. The method includes providing a substrate extending along a first direction, and a trench is formed crossing the substrate to define a first active region and a second active region. A lower isolation structure is formed in the trench, in which the lower isolation structure exposes a portion of a sidewall of the substrate. The exposed sidewall of the substrate is oxidized to form an upper isolation structure on the lower isolation structure, in which the upper isolation structure extends into the substrate. A conductive structure embedded in the upper isolation structure is formed, and a first transistor and a second transistor are respectively formed in the first active region and the second active region.

According to some embodiments of the present disclosure, a source/drain region of each of the first transistor and the second transistor has a bottom surface that is below a bottom surface of the conductive structure.

According to some embodiments of the present disclosure, the trench has a width that is greater than a width of the conductive structure.

According to some embodiments of the present disclosure, the upper isolation structure and the lower isolation structure collectively separates the conductive structure from the source/drain region of each of the first transistor and the second transistor.

According to some embodiments of the present disclosure, forming the first and second transistors includes forming a gate structure on the substrate of each of the first active region and the second active region, and the source/drain region is formed in the substrate of each of the first active region and the second active region, in which the source/drain regions are located at opposite sides of the upper isolation structure.

According to some embodiments of the present disclosure, the method further includes forming a plurality of contact plugs respectively connected to the source/drain region and the gate structure of each of the first and second transistors, and the conductive structure.

According to some embodiments of the present disclosure, a method of manufacturing a semiconductor structure is provided. The method includes providing a substrate including a plurality of active regions extending along a first direction, in which the active regions are separated from each other by a shallow trench isolation (STI) structure. A trench crossing the active regions and the STI structures is formed. An anti-fuse structure is formed in the trench, in which the anti-fuse structure includes an isolation structure covering the trench and a conductive structure embedded in the isolation structure. A transistor is formed in each of the active regions, in which the transistor is separated from the conductive structure by the isolation structure.

According to some embodiments of the present disclosure, forming the anti-fuse structure includes forming a lower portion of the isolation structure in the trench, in which the lower portion of the isolation structure has a height that is lower than a depth of the trench. An upper portion of the isolation structure laterally extending into the substrate if formed. The conductive structure is formed on the isolation structure.

According to some embodiments of the present disclosure, forming the transistor includes forming a gate structure on the substrate of each of the active regions. A source/drain region is formed in the substrate of each of the active regions, in which the source/drain region is adjacent to the gate structure and has a bottom surface that is below a bottom surface of the conductive structure.

According to some embodiments of the present disclosure, the method further includes forming a plurality of contact plugs respectively connected to the source/drain region, gate structure, and the conductive structure.

It is to be understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
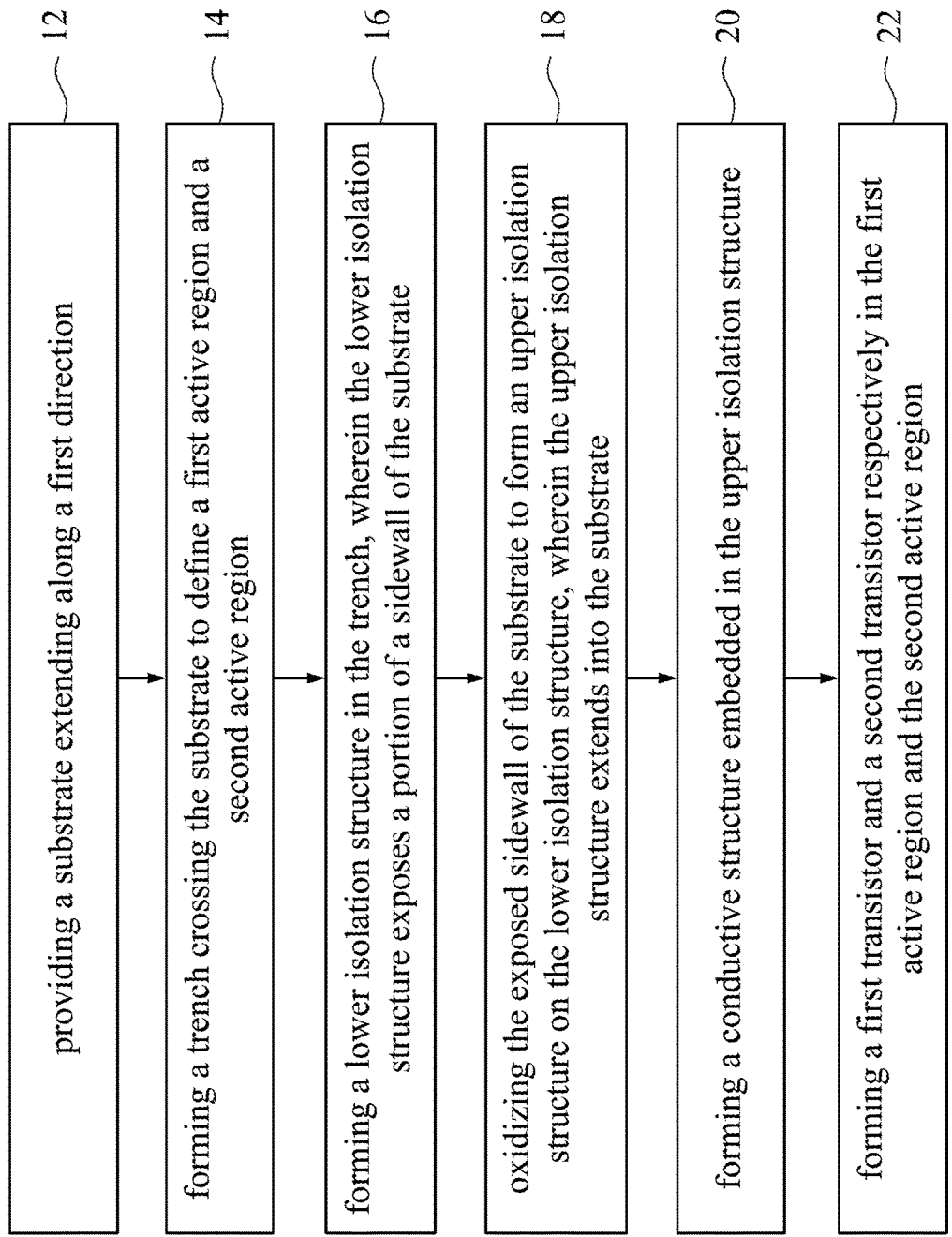
FIG. 1 is a flow chart illustrating a method of manufacturing a semiconductor structure in accordance with some embodiments of this disclosure.

Specific embodiments of the components and arrangements described below are intended to simplify the present disclosure. Of course, these are merely embodiments and are not intended to limit the present disclosure. For example, forming a first feature above or on a second feature in the subsequent description may include an embodiment in which the first feature and the second feature are formed as in direct contact, or include an embodiment in which an additional feature is formed between the first feature and the second feature such that the first feature and the second feature are not in direct contact. Additionally, component symbols and/or letters may be repeated in various embodiments of the present disclosure. This repetition is for the purpose of simplicity and clarity, and does not in itself indicate the relationship between the various embodiments and/or configurations discussed.

Furthermore, spatial relative terms, such as "below", "under", "above", "over", etc., are intended to facilitate description of the relative relationship between a component or feature and another component or feature, as shown in the drawings. The true meaning of these spatial relative terms includes other orientations. For example, when the illustration is flipped up and down by 180 degrees, the relationship between a component and another component may change from "below" or "under" to "above" or "over". Furthermore, the spatial relative narratives used herein should be interpreted the same.

FIG. 1 is a flow chart illustrating a method 10 of manufacturing a semiconductor structure in accordance with some embodiments of this disclosure. The method 10 includes operations 12, 14, 16, 18, 20, and 22. It is noted that the method depicted in FIG. 1 is merely an example, and is not intended to limit the present invention. Accordingly, additional operations may be performed before, during, and/or after the method depicted in FIG. 1, and some other operations may only be briefly described herein. FIGS. 2-4 and FIGS. 5A-11 are respectively top views and cross-sectional views of various intermediary stages in the manufacturing of semiconductor structure according to the method 10 of FIG. 1.

Figure 2:
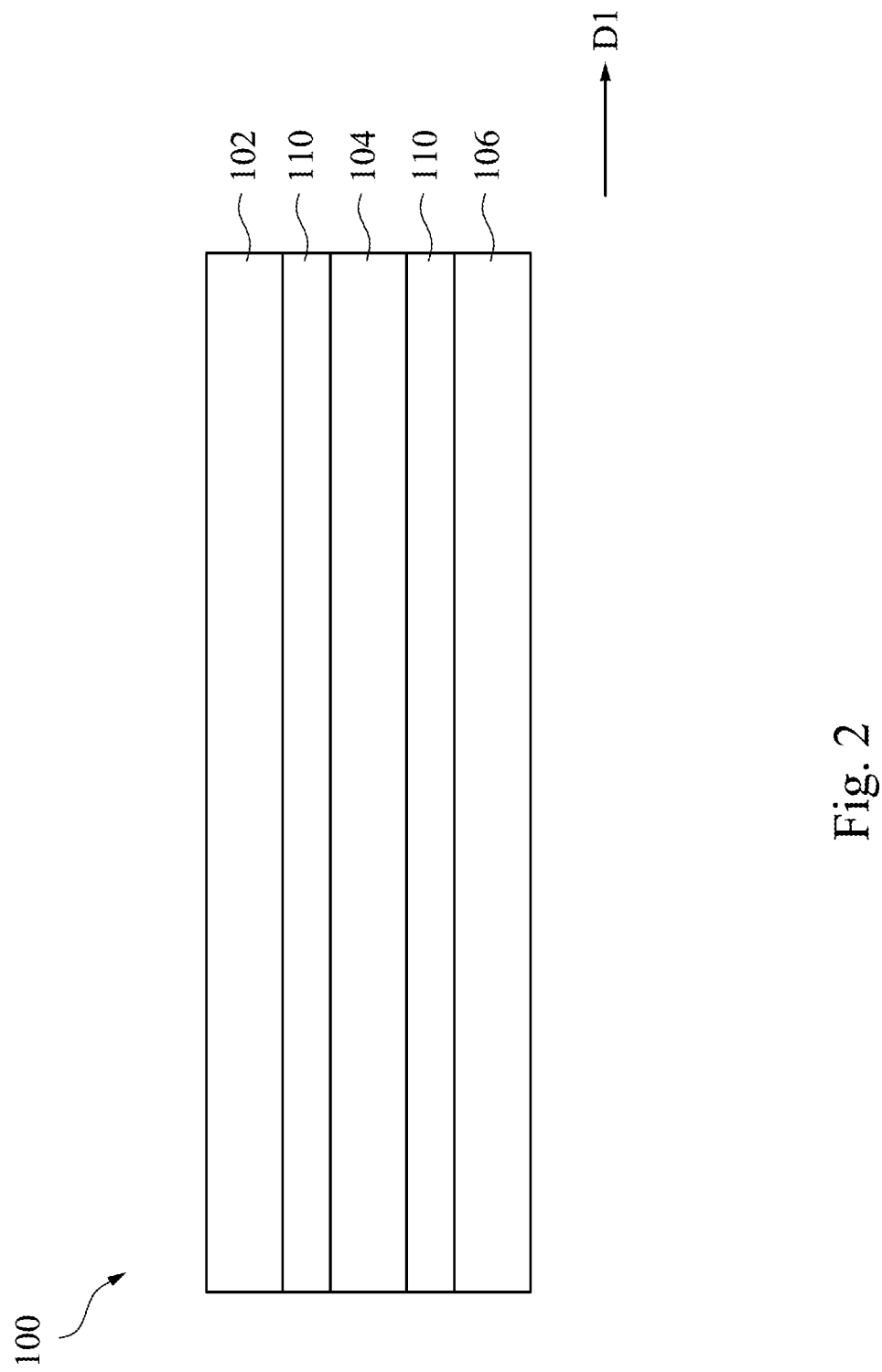
FIG. 2 to FIG. 4 are top views of various intermediary stages in the manufacturing of semiconductor structure in accordance with some embodiments of this disclosure.

Reference is made to FIG. 1 and FIG. 2. In the operation 12 of FIG. 1, a substrate 100 extending along a first direction D1 is provided. The substrate 100 may include a plurality of active regions 102, 104 and 106 extending along a first direction D1. The adjacent active regions are separated from each other by a shallow trench isolation (STI) structure 110. For example, as shown in FIG. 2, the STI structure 110 is between and separates the active region 102 and the active region 104. In some embodiments, the substrate 100 may be a single crystal semiconductor substrate or a polycrystalline semiconductor substrate made of silicon or silicon carbide, a compound semiconductor substrate made of silicon germanium or the like, a silicon on insulator (SOI) substrate, or the like. In some embodiments, the STI structure 110 includes tetraethoxysilane (TEOS), silicon oxide, silicon nitride, silicon oxy-nitride or fluoride-doped silicate (FSG).

Figure 3:
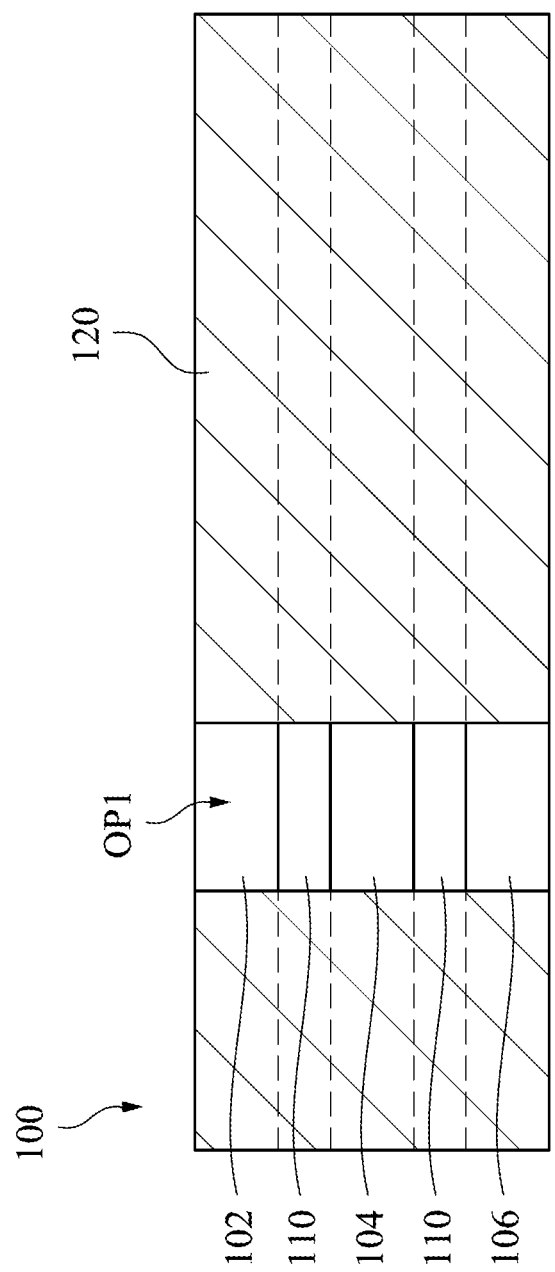

Referring to FIG. 3, a mask layer 120 is formed on the substrate 100 to cover the active regions 102, 104, 106 and the STI structure 110. In some embodiments, the mask layer 120 is made of silicon oxide, silicon nitride, silicon oxynitride, silicon carbide, another suitable material, or a combination thereof. The mask layer 120 may be formed on the substrate 100 by suitable deposition methods including a chemical vapor deposition (CVD) process, an atomic layer deposition (ALD) process, a physical vapor deposition (PVD) process or a combination thereof. In some embodiments, the mask layer 120 is patterned and has an opening OP1 to expose underlying structures. The mask layer 120 may be patterned by suitable method such as using photolithography patterning processes and etching processes. Therefore, the opening OP1 is formed in the mask layer 120 to expose a portion of the active regions 102, 104 and 106 and the STI structures 110.

Figure 4:
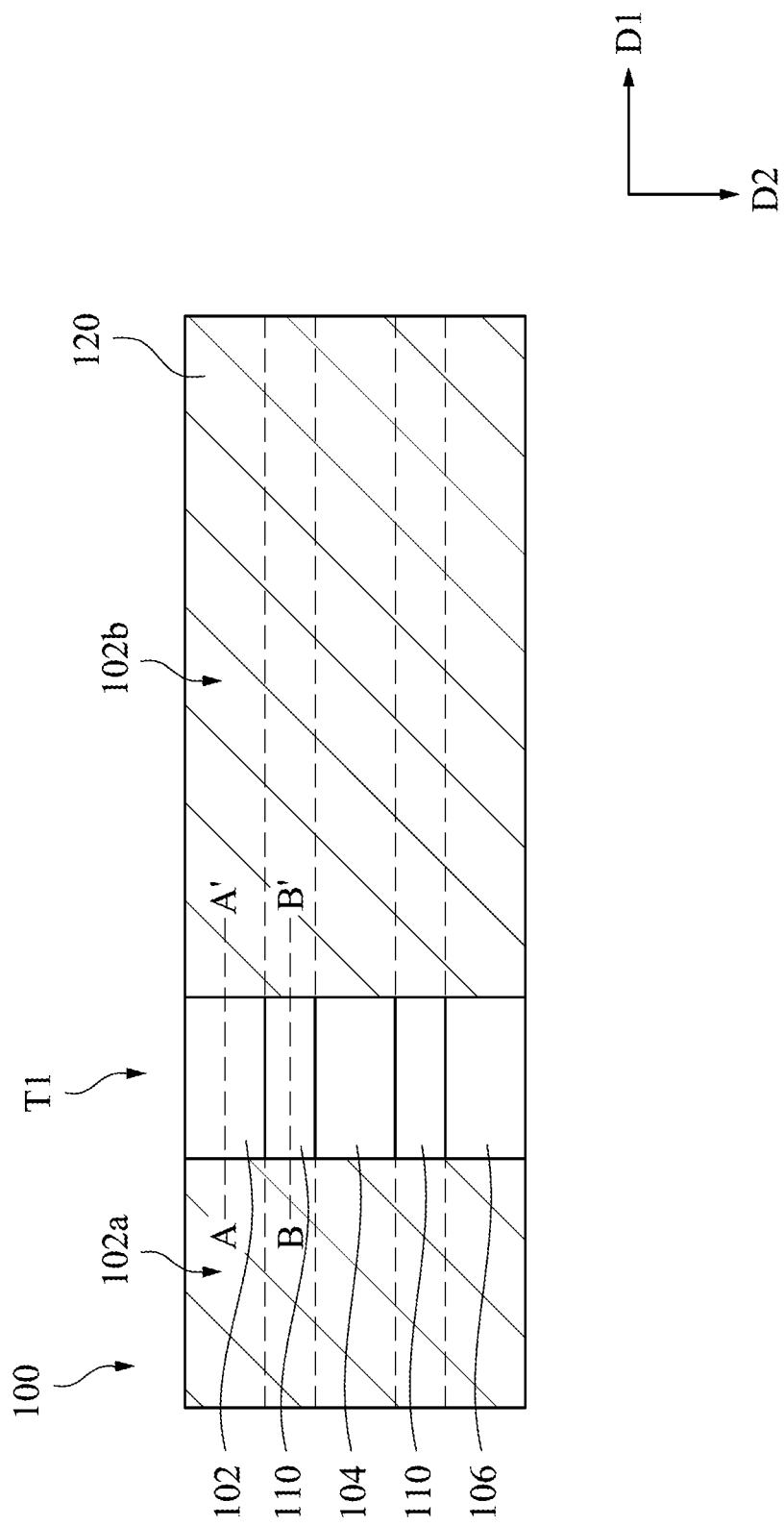

Reference is made to FIG. 1 and FIG. 4. In the operation 14 of FIG. 1, a trench T1 crossing the substrate 100 is formed. In some embodiments, the portion of active regions 102, 104 and 106 and the STI structures 110 exposed by the opening OP1 (shown in FIG. 3) are etched to formed the trench T1 in the substrate 100. The trench T1 extends along a second direction D2 to cross the active regions 102, 104 and 106 and the STI structures 110, such that the active regions 102, 104 and 106 are separated into a plurality of segments. For example, the trench T1 crosses the active region 102 to define a first active region 102a and a second active region 102b.

Figure 5B:
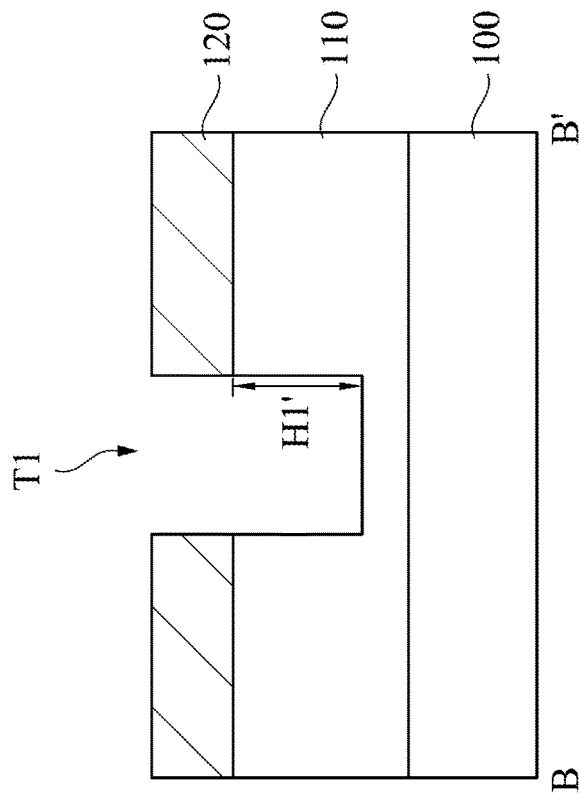
FIGS. 5B, 6B, 7B, 8B, 9B, and 10B are cross-sectional views illustrating various stages of a method for forming a semiconductor structure according to some embodiments of the present disclosure, taken along the line B-B' of FIG. 4.
Figure 5A:
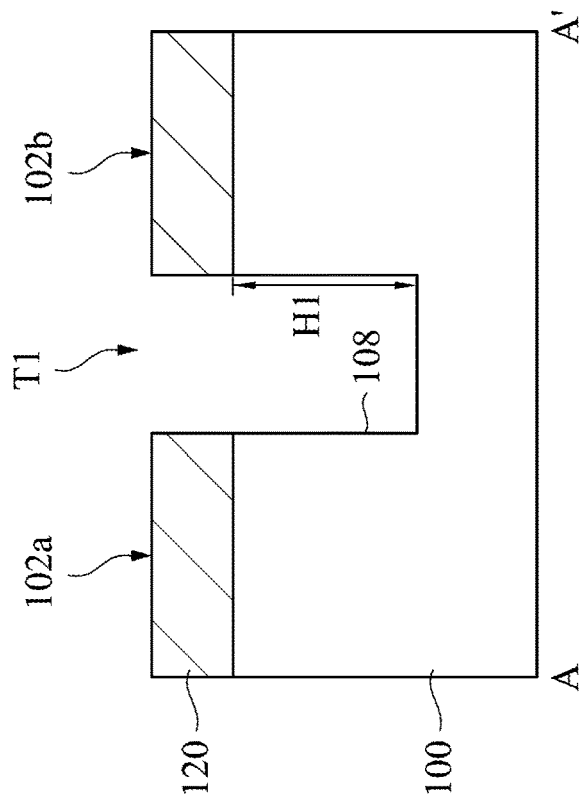
FIGS. 5A, 6A, 7A, 8A, 9A, and 10A are cross-sectional views illustrating various stages of a method for forming a semiconductor structure according to some embodiments of the present disclosure, taken along the line A-A' of FIG. 4.

FIG. 5A and FIG. 5B are cross-sectional respectively taken along the line A-A' and B-B' of FIG. 4. As shown in FIG. 5A, the trench T1 exposes a sidewall 108 of the substrate 100. A portion of the substrate 100 and the STI structure 110 may be etched to form the trench T1 by using suitable etching process. In some embodiments, the trench T1 has a depth H1 (shown in FIG. 5A) in the active region 102 that is deeper than a depth H1' (shown in FIG. 5B) in the STI structure 110. In the following operations, the cross-sectional view of the active region 102 and the adjacent STI structure 110 are illustrated as example.

Next, in the operation 16 of FIG. 1, a lower isolation structure 202 is formed in the trench T1. FIGS. 6A-7B illustrate the detail steps of implementing operation 16 in accordance with an embodiment of the present disclosure. FIGS. 6A-7A and FIGS. 6B-7B are cross-sectional respectively taken along the line A-A' and B-B' of FIG. 4.

Figure 6B:
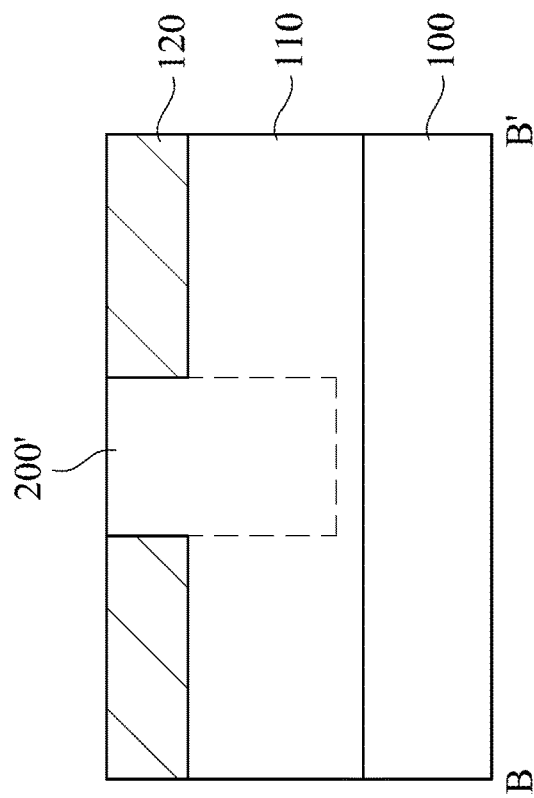
Figure 6A:
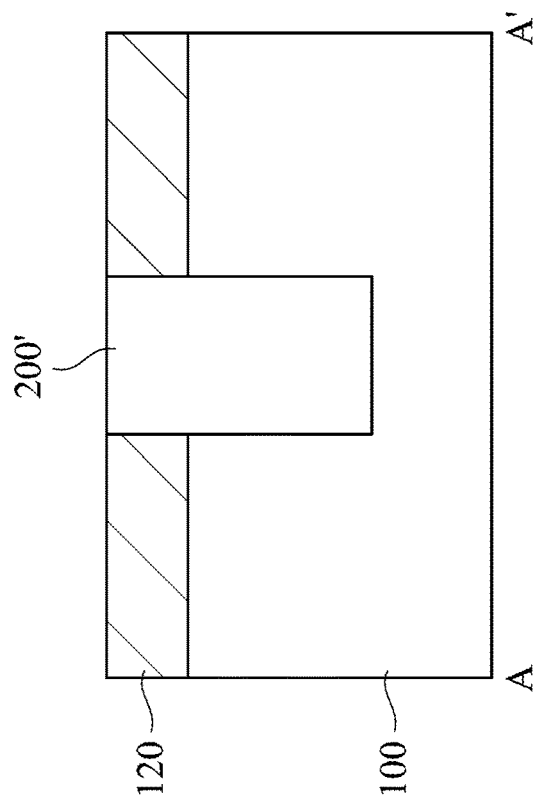

Referring to FIGS. 6A and 6B, the trench T1 is filled with an insulating material thereby forming the isolation layer 200'. In some embodiments, the isolation layer 200' includes silicon oxide, silicon nitride, silicon oxy-nitride, tetraethoxysilane (TEOS), or fluoride-doped silicate (FSG). In some examples, the material of the isolation layer 200' is same as that of the STI structure 110. The isolation layer 200' may be formed by suitable deposition methods including a CVD process, an ALD process, a PVD process or a combination thereof. In some embodiments, an isolation material may be formed in the trench T1 and cover a top surface of the mask layer 120, and subsequently performing a planarization process such as chemical mechanical polishing (CMP) process to form the isolation layer 200'.

Figure 7B:
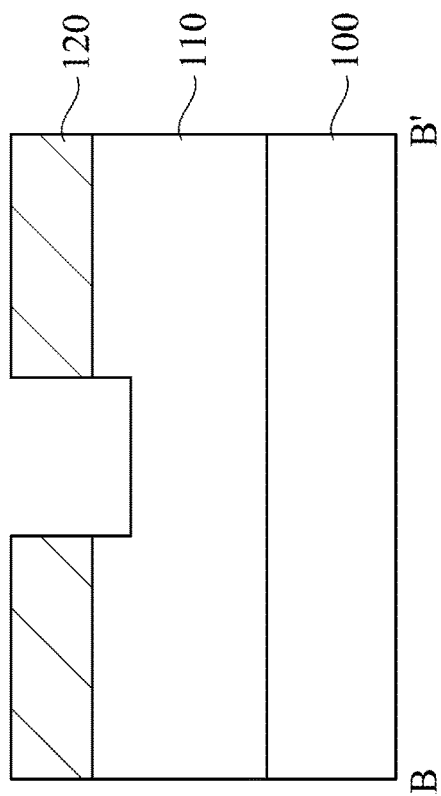
Figure 7A:
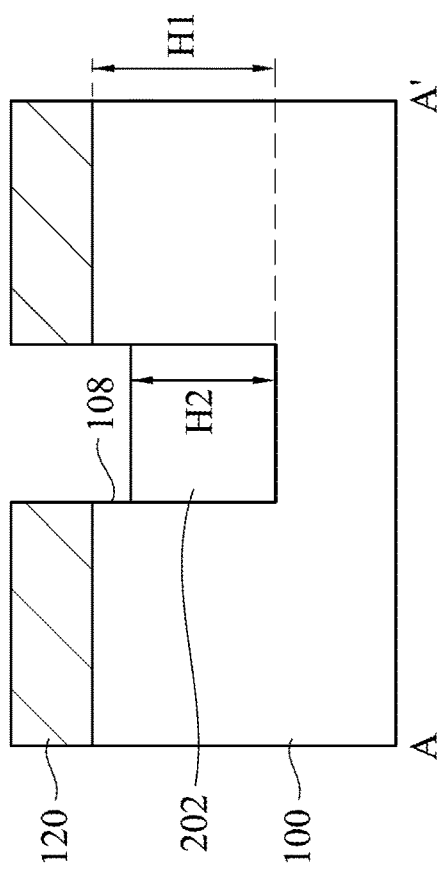

Next, referring to FIGS. 7A and 7B, the isolation layer 200' is recessed to form the lower isolation structure 202. The isolation layer 200' is recessed to expose a portion of the sidewall 108 of the substrate 100 to be oxidized in the subsequent step. In some embodiments, the lower isolation structure 202 is formed by using suitable anisotropic etching process, such as dry etching process. In some embodiments, the lower isolation structure 202 has a height H2 that is smaller than the depth H1 of the trench T1 in the substrate 100.

Figure 8A:
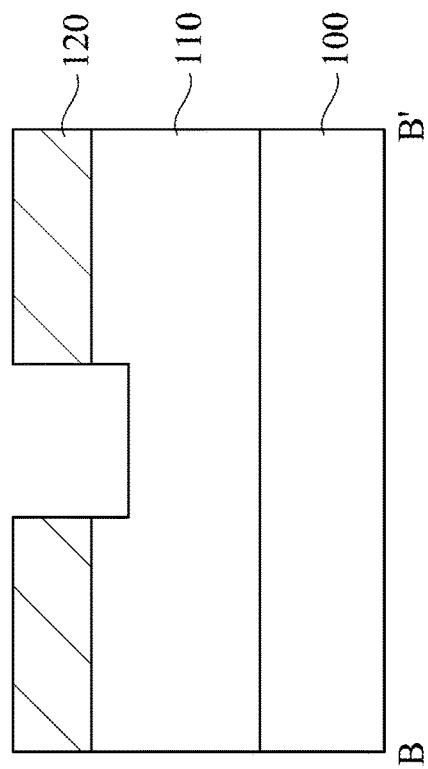
Figure 8B:
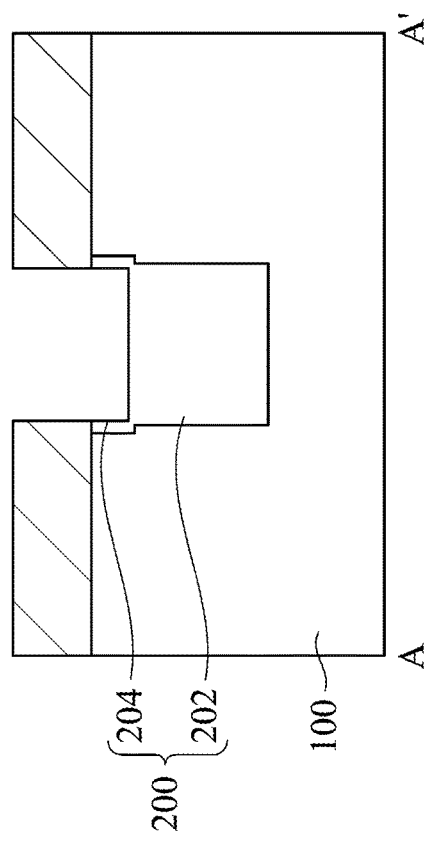

Reference is made to FIGS. 1 and 8A-8B. In the operation 18 of FIG. 1, the exposed sidewall 108 of the substrate 100 is oxidized to form an upper isolation structure 204 on the lower isolation structure 202, in which the upper isolation structure 204 extends into the substrate 100. In some embodiments, the upper isolation structure 204 is formed by performing a thermal oxidation process to oxidize the exposed sidewall 108 (shown in FIG. 7A) of the substrate 100. As shown in FIG. 8A, the upper isolation structure 204 laterally extends into the substrate 100. Specifically, the upper isolation structure 204 is formed on the lower isolation structure 202 and has an opening exposing a portion of a top surface of the lower isolation structure 202. As such, the upper isolation structure 204 and the lower isolation structure 202 collectively form an isolation structure 200 to cover a sidewall and a bottom of the trench T1.

Figure 9A:
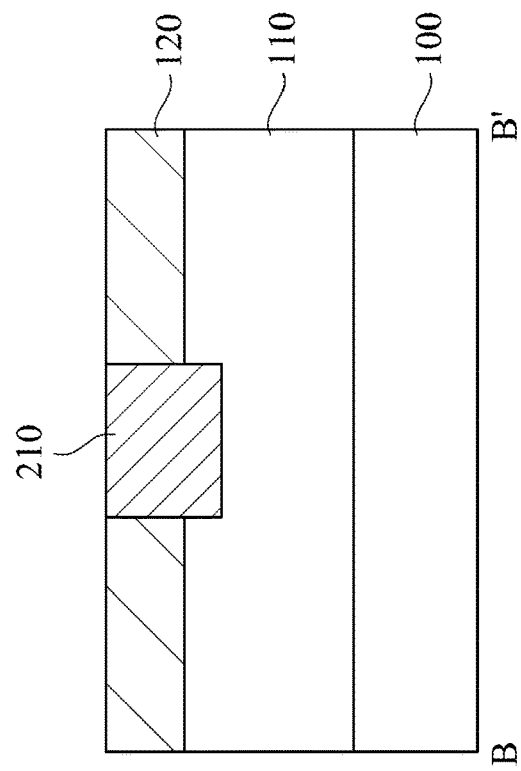
Figure 9B:
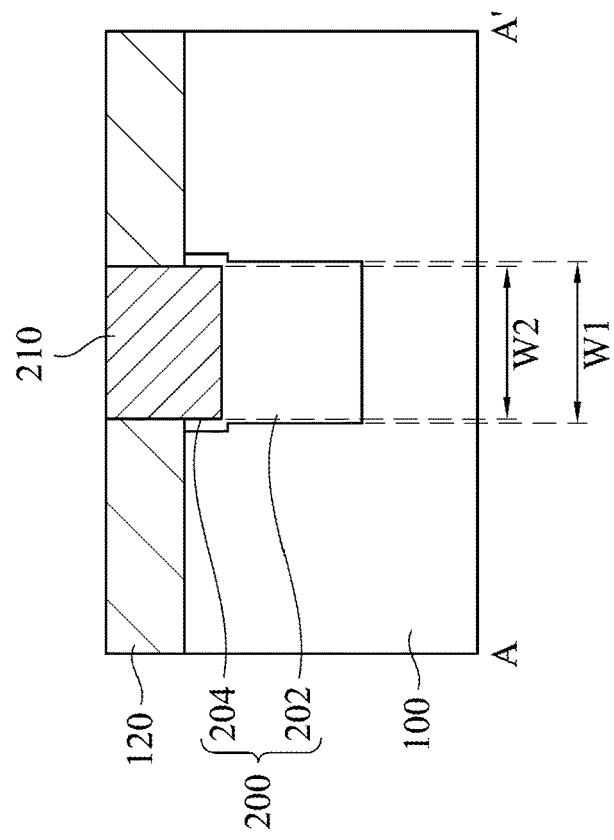

Reference is made to FIGS. 1 and 9A-9B. In the operation 20 of FIG. 1, a conductive structure 210 embedded in the isolation structure 200 is formed. In some embodiments, the conductive structure 210 is formed by suitable deposition methods including a chemical vapor deposition (CVD) process, an atomic layer deposition (ALD) process, a physical vapor deposition (PVD) process or a combination thereof. The conductive structure 210 is disposed on the exposed top surface of the lower isolation structure 202 shown in FIG. 8A. Specifically, a bottom portion of a sidewall of the conductive structure 210 is covered by the upper isolation structure 204. That is, the upper isolation structure 204 separates the conductive structure 210 from the substrate 100. As shown in FIG. 9A, the conductive structure 210 has a width W2 that is smaller than a width W1 of the trench T1. In some embodiments, the conductive structure 210 includes conductive material, such as polysilicon, metal, metal alloys, other suitable materials, and/or combinations thereof.

Figure 10A:
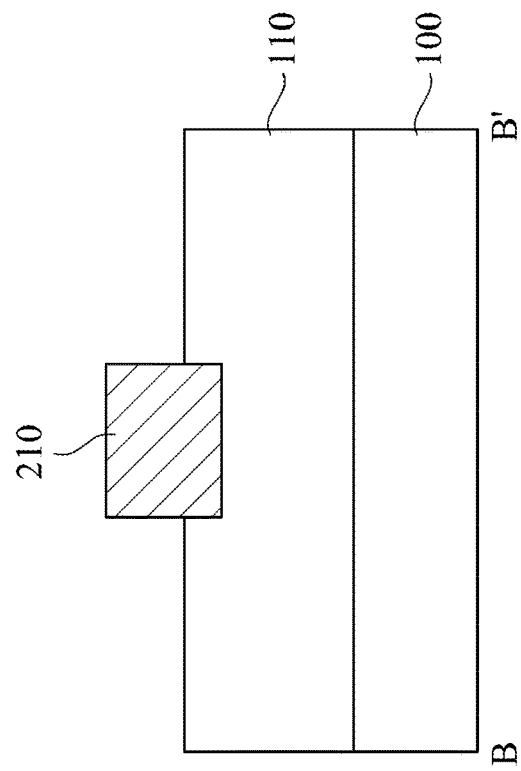
Figure 10B:
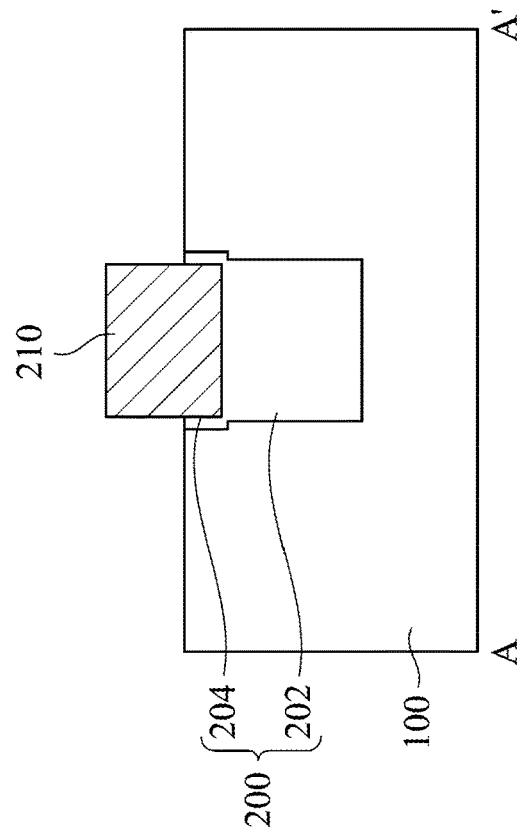

Referring to FIGS. 10A and 10B, after forming the conductive structure 210, the mask layer 120 (as shown in FIGS. 9A and 9B) is removed. Specifically, the mask layer 120 is removed by etching processes such as a dry etching process or a wet etching process to expose the top surface of the substrate 100.

Figure 11:
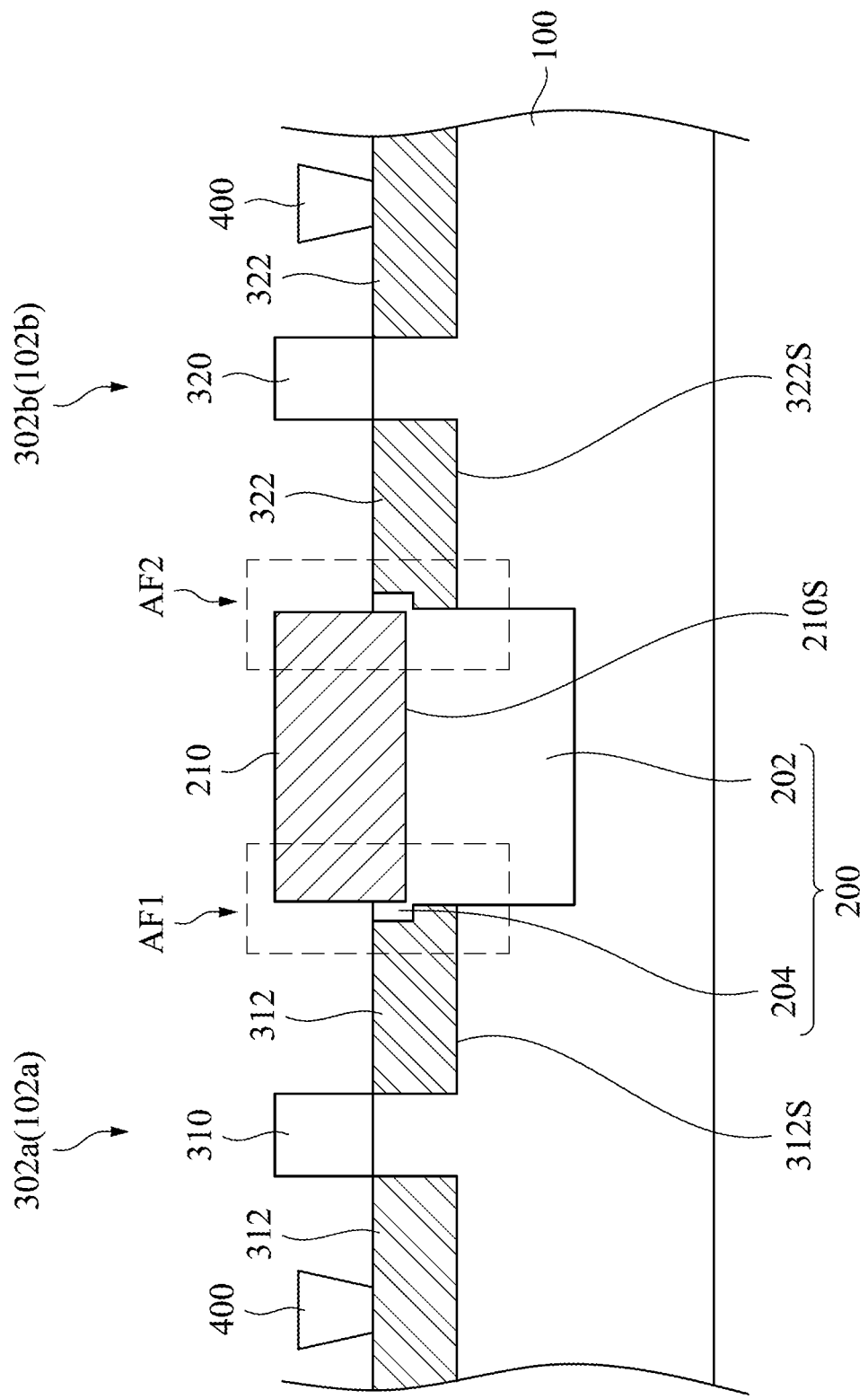
FIG. 11 is a cross-sectional view of a semiconductor structure according to some embodiments of the present disclosure.

Reference is made to FIG. 1 and FIG. 11. In the operation 22 of FIG. 1, a first transistor 302a and a second transistor 302b are respectively formed in the first active region 102a and the second active region 102b. As shown in FIG. 11, the first transistor 302a includes a gate structure 310 and source/drain regions 312, and the second transistor 302b includes a gate structure 320 and source/drain regions 322. In some embodiments, the first transistor 302a and the second transistor 302b are formed in a p-well region (not shown) of the substrate 100. The source/drain regions 312 and 322 are located at opposite sides of the isolation structure 200 and adjacent to the gate structures 310 and 320, respectively. The source/drain regions 312 and 322 respectively have a bottom surface 312s and 322s that is below a bottom surface 210s of the conductive structure 210, such that the conductive structure is completely isolated from the p-well region of the substrate 100 to prevent the leakage issue.

The formation of the first transistor 302a may include forming the gate structure 310 on the substrate 100 of the first active region 102a, and forming the source/drain region 312 in the substrate 100 of the first active region 102a. For example, the formation of the gate structure 310 may include a suitable deposition method such as a CVD process, a PVD process, or the like. In some embodiments, the gate structure 310 includes polysilicon, a metal such as aluminum (Al), copper (Cu), or tungsten (W), other conductive materials, or combinations thereof. In addition, the source/drain region 312 may be formed by performing an ion implantation process, and the depth of doping must be deeper than the bottom surface 210s of the conductive structure 210. In some embodiments, the source/drain region 312 is doped with N-type dopants such as phosphorus or arsenic. The material and the formation of the gate structure 320 and the source/drain region 322 of the second transistor 302b may be the same as that of the first transistor 302a described above, and will not be repeated hereinafter. It is noted that other transistors (not shown) may also be formed in the other active regions (e.g., active regions 104 and 106) by the process described above.

In some embodiments, after forming the first transistor 302a and the second transistor 302b, the method further includes forming a plurality of contact plugs respectively connected to the source/drain regions 312 and 322 and the gate structures 310 and 320 of each of the first and second transistors 302a and 302b, and the conductive structure 210. For example, the contact plugs 400 are grounded and respectively connected to the source/drain regions 312 and 322 which are away from the isolation structure 200.

Reference is still made to FIG. 11, the isolation structure 200 separates the conductive structure 210 from the source/drain regions 312 and 322 of each of the first transistor 302a and the second transistor 302b. A pair of anti-fuse structures AF1 and AF2 is formed between the transistors 302a and 302b. The conductive structure 210 is functioned as a top plate of the anti-fuse structures AF1 and AF2. The source/drain regions 312 and 322 are functioned as a bottom plate of the anti-fuse structures AF1 and AF2. The isolation structure 200, specifically, the upper isolation structure 204, is function as a dielectric layer between the top plate and the bottom plate of the anti-fuse structures AF1 and AF2. Specifically, the anti-fuse structure AF1 includes the conductive structure 210, the isolation structure 200 and the source/drain region 312 which is shared with the transistor 302a. Similarly, the anti-fuse structure AF2 includes the conductive structure 210, the isolation structure 200 and the source/drain region 322 which is shared with the transistor 302b. A voltage may be applied to both ends of the anti-fuses AF1 and AF2 (i.e., the source/drain region 312 and 322 and the conductive structure 210) to induce a breakdown of the dielectric layer, which results in a rupture of the dielectric layer.

As described above, according to the embodiments of the present disclosure, a method of manufacturing a semiconductor structure is provided. In the manufacturing of the semiconductor structure of the present disclosure, an isolation structure separates a substrate into a plurality of active regions. A conductive structure is then embedded from a top surface of the isolation structure, and transistors are formed in the active region on the opposite sides of the isolation structure. Therefore, a pair of anti-fuse structure is formed between two adjacent transistors, and can be blown out at the same time. In other words, the method of the present disclosure can decrease the size of a semiconductor structure having anti-fuse structure and transistor, thereby achieving a high device density.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of manufacturing a semiconductor structure, comprising:
   providing a substrate extending along a first direction;
   forming a trench crossing the substrate to define a first active region and a second active region;
   forming a lower isolation structure in the trench, wherein the lower isolation structure exposes a portion of a sidewall of the substrate;
   oxidizing the exposed sidewall of the substrate to form an upper isolation structure on the lower isolation structure, wherein the upper isolation structure extends into the substrate;
   forming a conductive structure embedded in the upper isolation structure; and
   forming a first transistor and a second transistor respectively in the first active region and the second active region.

2. The method of claim 1, wherein a source/drain region of each of the first transistor and the second transistor has a bottom surface that is below a bottom surface of the conductive structure.

3. The method of claim 2, wherein the upper isolation structure and the lower isolation structure collectively separates the conductive structure from the source/drain region of each of the first transistor and the second transistor.

4. The method of claim 1, wherein the trench has a width that is greater than a width of the conductive structure.

5. The method of claim 1, wherein forming the first and second transistors comprises:
   forming a gate structure on the substrate of each of the first active region and the second active region; and
   forming a source/drain region in the substrate of each of the first active region and the second active region, wherein the source/drain regions are located at opposite sides of the upper isolation structure.

6. The method of claim 5, further comprising forming a plurality of contact plugs respectively connected to the source/drain region and the gate structure of each of the first and second transistors, and the conductive structure.

7. A method of manufacturing a semiconductor structure, comprising:
   providing a substrate comprising a plurality of active regions extending along a first direction, wherein the active regions are separated from each other by a shallow trench isolation (STI) structure;
   forming a trench crossing the active regions and the STI structures;
   forming an anti-fuse structure in the trench, wherein the anti-fuse structure comprises an isolation structure covering the trench and an conductive structure embedded in the isolation structure; and
   forming a transistor in each of the active regions, wherein the transistor is separated from the conductive structure by the isolation structure.

8. The method of claim 7, wherein forming the anti-fuse structure comprises:
   forming a lower portion of the isolation structure in the trench, wherein the lower portion of the isolation structure has a height that is lower than a depth of the trench;
   forming an upper portion of the isolation structure laterally extending into the substrate; and
   forming the conductive structure on the isolation structure.

9. The method of claim 7, wherein forming the transistor comprises:
   forming a gate structure on the substrate of each of the active regions; and
   forming a source/drain region in the substrate of each of the active regions, wherein the source/drain region is adjacent to the gate structure and has a bottom surface that is below a bottom surface of the conductive structure.

10. The method of claim 9, further comprising forming a plurality of contact plugs respectively connected to the source/drain region, gate structure, and the conductive structure.

* * * * *